(12) United States Patent
Cheng et al.

(10) Patent No.: US 11,688,830 B2
(45) Date of Patent: Jun. 27, 2023

(54) PIXEL UNIT, DISPLAY SUBSTRATE AND DISPLAY PANEL WITH SHIELDING AUXILIARY ELECTRODE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1062 days.

(21) Appl. No.: 15/779,278

(22) PCT Filed: Sep. 21, 2017

(86) PCT No.: PCT/CN2017/102606
§ 371 (c)(1),
(2) Date: May 25, 2018

(87) PCT Pub. No.: WO2018/176757
PCT Pub. Date: Oct. 4, 2018

(65) Prior Publication Data
US 2021/0210658 A1    Jul. 8, 2021

(30) Foreign Application Priority Data
Mar. 31, 2017  (CN) .......................... 201710209154.5

(51) Int. Cl.
*H01L 33/38*  (2010.01)
*H01L 33/40*  (2010.01)
(Continued)

(52) U.S. Cl.
CPC ............. *H01L 33/382* (2013.01); *G09G 3/32* (2013.01); *H01L 25/0753* (2013.01);
(Continued)

(58) Field of Classification Search
CPC ........ H01L 33/382; H01L 33/40; H01L 33/62
See application file for complete search history.

(56) References Cited

U.S. PATENT DOCUMENTS

2004/0252565 A1* 12/2004 Yamazaki ............ G09G 3/3233
365/202
2004/0263441 A1  12/2004 Tanaka
(Continued)

FOREIGN PATENT DOCUMENTS

| CN | 1967864 A | 5/2007 |
| CN | 101728418 A | 6/2010 |

(Continued)

OTHER PUBLICATIONS

Office action from European Application No. 17877385.9 dated Dec. 4, 2020.
(Continued)

*Primary Examiner* — Didarul A Mazumder
*Assistant Examiner* — Gustavo G Ramallo
(74) *Attorney, Agent, or Firm* — Calfee, Halter & Griswold LLP

(57) ABSTRACT

The present disclosure provides a display substrate which includes: a plurality of pixel units, at least one of which includes a light emitting diode and a drive circuit. The light emitting diode includes a cathode; the display substrate further includes an auxiliary electrode layer including at least one auxiliary electrode. The auxiliary electrode is disposed in at least one of the pixel units. The auxiliary electrode is electrically connected with the cathode of the light emitting diode which is located in the same pixel unit as the pixel unit that the auxiliary electrode is located in, and the auxiliary electrode covers at least a portion of the drive circuit in the pixel unit that the auxiliary electrode is located in. The auxiliary electrode is made of an opaque conductive (Continued)

material, so as to block light irradiated at the portion of the drive circuit that is covered by the auxiliary electrode.

14 Claims, 1 Drawing Sheet

(51) Int. Cl.
    *H01L 33/62*     (2010.01)
    *G09G 3/32*     (2016.01)
    *H01L 25/075*     (2006.01)

(52) U.S. Cl.
    CPC .............. *H01L 33/40* (2013.01); *H01L 33/62* (2013.01); *G09G 2300/0426* (2013.01)

(56) References Cited

U.S. PATENT DOCUMENTS

| | | | | |
|---|---|---|---|---|
| 2005/0104220 | A1* | 5/2005 | Tsuchiya | H01L 24/16 257/774 |
| 2005/0269945 | A1 | 12/2005 | Su | |
| 2008/0100209 | A1 | 5/2008 | Ito et al. | |
| 2009/0066236 | A1 | 3/2009 | Sung et al. | |
| 2010/0102713 | A1* | 4/2010 | Seo | H01L 51/525 313/504 |
| 2010/0127238 | A1* | 5/2010 | Kim | H01L 33/387 977/773 |
| 2012/0168889 | A1* | 7/2012 | Ooka | H01L 31/02327 257/E31.127 |
| 2014/0252317 | A1 | 9/2014 | Gupta et al. | |
| 2016/0026285 | A1* | 1/2016 | Qin | G02F 1/13338 345/174 |
| 2016/0357063 | A1* | 12/2016 | Liu | G02B 5/3058 |
| 2017/0294565 | A1* | 10/2017 | Kim | H01L 33/62 |
| 2017/0358503 | A1* | 12/2017 | Liu | H01L 21/288 |

FOREIGN PATENT DOCUMENTS

| | | |
|---|---|---|
| CN | 104393188 A | 3/2015 |
| CN | 104576705 A | 4/2015 |
| CN | 104952905 A | 9/2015 |
| CN | 106449722 A | 2/2017 |
| EP | 2182564 A1 | 5/2010 |
| KR | 100778443 | 11/2007 |
| KR | 20160038174 | 4/2016 |

OTHER PUBLICATIONS

First Office Action for Chinese Patent Application No. 201710209154.5 dated Feb. 25, 2019.
Search Report and Written Opinion for International Application No. PCT/CN2017/102606 dated Jan. 8, 2018.

\* cited by examiner

PIXEL UNIT, DISPLAY SUBSTRATE AND DISPLAY PANEL WITH SHIELDING AUXILIARY ELECTRODE

CROSS REFERENCE

The present application claims the priority of Chinese Patent Application No. 201710209154.5, filed on Mar. 31, 2017, and the entire contents thereof are incorporated herein by reference as part of the present application.

TECHNICAL FIELD

The present disclosure relates to the technical field of display devices, in particular, to a pixel unit, a display substrate and a display panel including the display substrate.

BACKGROUND

The existing light emitting diode display substrate includes, in addition to the light emitting diode, a thin film transistor array for controlling light emission of the light emitting diode. The thin film transistor array includes a plurality of thin film transistors. Since the active layer of the thin film transistor is made of a semiconductor material, long-term irradiation may affect the performance of the thin film transistor to generate a leakage current.

Therefore, how to eliminate the influence of long-time irradiation on the performance of the thin film transistor has become a technical problem to be solved in the art.

SUMMARY

As one aspect of the present disclosure, there is provided a display substrate including: a plurality of pixel units, at least one of which includes a light emitting diode and a drive circuit, the light emitting diode including a cathode; and an auxiliary electrode layer including at least one auxiliary electrode, wherein the at least one auxiliary electrode is disposed in at least one of the plurality of the pixel units, wherein the auxiliary electrode is electrically connected with the cathode of the light emitting diode which is located in the same pixel unit that the auxiliary electrode is located in, and the auxiliary electrode covers at least a portion of the drive circuit in the pixel unit that the auxiliary electrode is located in, the auxiliary electrode is made of an opaque conductive material, so as to block light irradiated at the portion of the drive circuit that is covered by the auxiliary electrode.

According to an embodiment, each pixel unit is disposed with the auxiliary electrode.

According to an embodiment, the display substrate includes a pixel define layer which divides the display substrate into a plurality of the pixel units, the auxiliary electrode layer is located on the pixel define layer, and an orthographic projection of the auxiliary electrode layer on a substrate of the display substrate and an orthographic projection of at least a portion of the drive circuit on the substrate are located within a range of an orthographic projection of the pixel define layer on the substrate.

According to an embodiment, the auxiliary electrode is in contact with the cathode directly and is located on the cathode.

According to an embodiment, the display substrate further includes a passivation layer covering the auxiliary electrode layer.

According to an embodiment, the drive circuit includes a switching transistor and a driving transistor, and the auxiliary electrode includes a first auxiliary electrode for covering the switching transistor and a second auxiliary electrode for covering the driving transistor.

According to an embodiment, the auxiliary electrode layer further includes auxiliary electrode line, the display substrate includes a gate line and a data line, and the auxiliary electrode line is for covering the gate line and/or the data line.

According to an embodiment, the auxiliary electrode line is integrated with the auxiliary electrode.

According to another aspect of the present disclosure, there is provided a display panel including a display substrate and a packaging cover plate for packaging the display substrate, wherein the display substrate is one of the above substrate provided by the present disclosure.

According to another aspect of the present disclosure, there is provided a pixel unit which includes: a light emitting diode including a cathode; a drive circuit configured to control the light emission of the light emitting diode; and an auxiliary electrode electronically connected with the cathode and covering at least a portion of the drive circuit, wherein the auxiliary electrode is made of an opaque conductive material, so as to block light irradiated at the portion of the drive circuit that is covered by the auxiliary electrode.

According to an embodiment, the auxiliary electrode is in contact with the cathode directly and is located on the cathode.

According to an embodiment, the drive circuit includes a switching transistor and a driving transistor, the auxiliary electrode includes a first auxiliary electrode for covering the switching transistor and a second auxiliary electrode for covering the driving transistor.

BRIEF DESCRIPTION OF THE DRAWINGS

The accompanying drawings are used to provide a further understanding of the present disclosure and constitute a part of the specification, and together with the following specific embodiments, serve to explain the present disclosure, but do not constitute limitations on the present disclosure. Where.

DETAILED DESCRIPTION

The specific embodiments of the present disclosure will be described in detail below with reference to the accompanying drawings. It should be understood that the specific embodiments described herein are only used to illustrate and explain the present disclosure, and are not used to limit the present disclosure.

Figure 1:
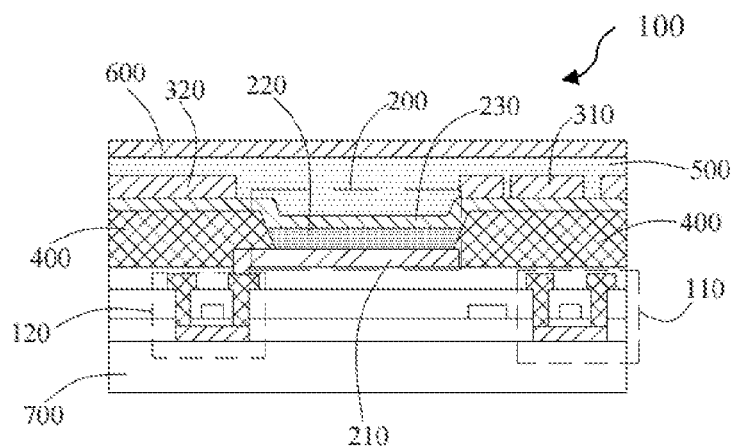
FIG. 1 is a sectional view of a portion of a display substrate according to the present disclosure.

According to an aspect of the present disclosure, there is provided a display substrate including a plurality of pixel units 100. As shown in FIG. 1, a light emitting diode 200 and a drive circuit are disposed in each of the pixel units, and the light emitting diode includes a cathode 230. The display substrate further includes an auxiliary electrode layer, the auxiliary electrode layer includes at least one auxiliary electrode, and at least one of the pixel units is provided with the auxiliary electrode. The auxiliary electrode is electrically connected with the cathode 230 of the light emitting diode 200 which is located in the same pixel unit as the pixel unit that the auxiliary electrode is located in, and the auxiliary electrode covers at least a portion of the drive circuit in the pixel unit that the auxiliary electrode is located in. The auxiliary electrode is made of an opaque conductive material, so as to block light irradiated at the portion of the drive circuit that is covered by the auxiliary electrode.

It is easy to understand that the drive circuit includes a plurality of thin film transistors. In the display substrate provided by the present disclosure, the thin film transistor in the portion of the drive circuit covered by the auxiliary electrode is not directly irradiated, or receives less external light, thereby reducing the leakage current of the thin film transistor in this portion of the drive circuit. As a result, the display effect of the display panel including the display substrate can be improved.

Since the auxiliary electrode and the cathode 230 of the light emitting diode 200 are electrically connected, when the display panel including the display substrate is operated, the auxiliary electrode and the cathode of the light emitting diode are connected in parallel to form an integral structure, and the resistance of the integral structure is smaller than the resistance of the cathode of the light emitting diode. This reduces the power consumption of the display panel including the display substrate when operated.

In the present disclosure, there is no particular limitation on the material of the auxiliary electrode. For example, the auxiliary electrode may be made of a metal material with low resistance and good light-shielding property. For example, the auxiliary electrode may be manufactured using copper. In one embodiment, the light transmittance of the auxiliary electrode may be less than 10%.

In the embodiment shown in FIG. 1, the light emitting diode 200 includes an anode 210, a light emitting layer 220, and a cathode 230. The auxiliary electrode then includes a first auxiliary electrode 310 and a second auxiliary electrode 320. The thin film transistor in the drive circuit includes a switching transistor 110 and a driving transistor 120. Correspondingly, the first auxiliary electrode 310 is located above the switching transistor 110 and blocks the switching transistor 110. The second auxiliary electrode 320 is located above the driving transistor 120 and blocks the driving transistor 120.

In the present disclosure, only the auxiliary electrode is used to block the drive circuit, and therefore, the auxiliary electrode has a pattern instead of a full-surface as the electrode. It should be noted that for the top light emitting diode, when the auxiliary electrode is formed, the light emitting layer of the light emitting diode should not be shielded, so that a good display effect can be ensured.

In order to achieve a better shielding effect, for example, the auxiliary electrode is provided in each of the pixel units.

In the present disclosure, the display substrate may be divided into a plurality of pixel units using the pixel define layer 400. The auxiliary electrode layer is located on the pixel define layer, and the orthogonal projection of the auxiliary electrode layer on the substrate 700 of the display substrate and the orthographic projection of at least a portion of the drive circuit on the substrate 700 are located within the range of the orthogonal projection of the pixel define layer on the substrate.

The pixel define layer 400 is a boundary of a pixel unit and is not used for emitting light. Arranging the auxiliary electrode on the pixel define layer can increase the aperture ratio of the display substrate. For example, a pixel define layer may be made of silicon oxide or silicon nitride.

In the present disclosure, there is no special limitation on how to electrically connect the auxiliary electrode with the cathode 230. For example, after the cathode layer is formed, an insulating layer is formed on the cathode, a via hole is formed on the insulating layer, and then the auxiliary electrode layer is formed. The insulating layer may be a silicon nitride layer or a silicon oxide layer, and the auxiliary electrode layer can be formed by sputtering. The insulating layer can be used to protect the cathode. The auxiliary electrode of the auxiliary electrode layer is electrically connected to the cathode 230 of the light emitting diode 200 through the via hole. Alternatively, as shown in FIG. 1, the auxiliary electrode may be directly formed on the cathode 230 and directly in contact with the cathode 230, so that the contact resistance between the auxiliary electrode and the cathode 230 may be reduced.

In the present disclosure, the auxiliary electrode layer shown in FIG. 1 can be formed using the following method.

A photoresist layer is formed on the cathode layer;

The photoresist layer is exposed and developed to form a trench, the shape and position of the trench are consistent with the auxiliary electrode layer;

A metal material layer is deposited and the metal materials that falls into the trench are formed as the auxiliary electrode;

The photoresist is striped.

To protect the auxiliary electrode layer and the cathode 230, for example, the display substrate further includes a passivation layer 500 covering the auxiliary electrode layer, as shown in FIG. 1.

As described above, the drive circuit includes a switching transistor 110 and a driving transistor 120. The switching transistor 110 is generally used to control the timing of turning on the driving transistor 120, and the driving transistor 120 is used to control the magnitude of the current that drives the light emitting diode to emit light. In the present disclosure, the auxiliary electrode includes a first auxiliary electrode 310 for covering the switching transistor 110 and a second auxiliary electrode 320 for covering the driving transistor 120. In the embodiment shown in FIG. 1, both the switching transistor 110 and the driving transistor 120 are shielded. Therefore, in the process when the light emitting diode is driven to emit light, no leakage current is generated in the switching transistor 110 and the driving transistor 120, and thus the display panel including the display substrate has a better display effect when operated.

Figure 2:
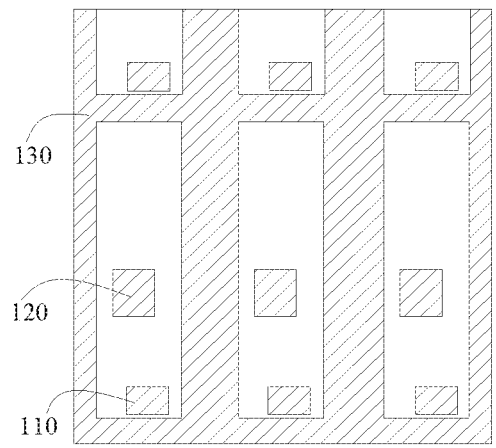
FIG. 2 is a top view of one embodiment of the auxiliary electrode layer.
Figure 3:
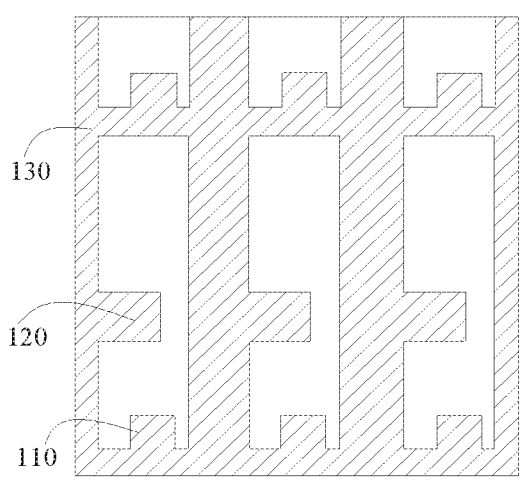
FIG. 3 is a top view of another embodiment of the auxiliary electrode layer.

For example, as shown in FIGS. 2 and 3, the auxiliary electrode layer further includes an auxiliary electrode line 130, the display substrate includes a gate line and a data line, and the auxiliary electrode line 130 covers the gate line and/or the data line. After the auxiliary electrode lines is added, the resistance of the integral structure that is formed by connecting the auxiliary electrode with the cathode in parallel can be further reduced, and can also shield the data lines and/or the gate lines, thereby enhancing the display effect.

In the embodiment shown in FIG. 2, the auxiliary electrode lines and the auxiliary electrodes are independent from each other, but the present disclosure is not limited thereto.

For example, as shown in FIG. 3, the auxiliary electrode line is integrally formed with the auxiliary electrode. As a result, the pattern of the mask plate for manufacturing the auxiliary electrode layer can be simplified and the manufacturing cost can be reduced. In one embodiment, the auxiliary electrode line and the auxiliary electrode may be simultaneously formed with one patterning process. For example, the one conductive layer may be patterned to simultaneously form the auxiliary electrode line and the auxiliary electrode, thereby reducing manufacturing costs.

According to another aspect of the present disclosure, a display panel is provided. The display panel includes a display substrate and a packaging cover plate 600 for packaging the display substrate. The package cover plate 600 may also be a packaging film layer. The display substrate is the above-mentioned display substrate provided by the present disclosure.

As described above, since at least a portion of the drive circuit of the display substrate can be shielded, when the display panel performs display, the leakage current is reduced, and even no leakage current occurs, so that the display effect of the display panel can be optimized. In addition, the auxiliary electrode is made of a conductive material and is connected in parallel with the cathode of the light emitting diode to form an integral structure, and the resistance of the integral structure is smaller than the resistance of the cathode of the light emitting diode, thereby reducing the power consumption of the display panel including the display substrate when operated.

In the display substrate provided by the present disclosure, the thin film transistor in the portion of the drive circuit covered by the auxiliary electrode is not directly irradiated, or receives less external light, thereby reducing the leakage current of the thin film transistor in the portion of the drive circuit. As a result, the display effect of the display panel including the display substrate can be improved.

Since the auxiliary electrode and the cathode of the light emitting diode are electrically connected, when the display panel including the display substrate is operated, the auxiliary electrode and the cathode of the light emitting diode are connected in parallel to form an integral structure, and the integral structure has lower resistance than that of the cathode of the light emitting diode, thereby reducing the power consumption of the display panel including the display substrate at the time of display.

It can be understood that the above embodiments are merely exemplary embodiments employed to illustrate the principle of the present disclosure, but the present disclosure is not limited thereto. For a person of ordinary skill in the art, various variations and improvements may be made without departing from the spirit and essence of the present disclosure, and these variations and improvements are also considered to be within the protection scope of the present disclosure.

What is claimed is:

1. A display substrate, comprising:
a plurality of pixel units, at least one pixel unit comprising a light emitting diode and a drive circuit, the light emitting diode comprising a cathode; and
an auxiliary electrode layer comprising at least one auxiliary electrode, wherein the at least one auxiliary electrode is disposed in at least one of the plurality of the pixel units,
wherein the auxiliary electrode is electrically connected with the cathode of the light emitting diode which is located in the same pixel unit as the pixel unit that the auxiliary electrode is located in, and the auxiliary electrode covers at least a portion of the drive circuit in the pixel unit that the auxiliary electrode is located in, the auxiliary electrode is made of an opaque conductive material, so as to block light irradiated at the portion of the drive circuit that is covered by the auxiliary electrode,
wherein the auxiliary electrode layer further comprises auxiliary electrode line, the display substrate comprises a gate line and a data line, and the auxiliary electrode line is for covering the gate line and/or the data line,
wherein the auxiliary electrode line and the auxiliary electrode are independent from each other but being a same conductive material,
wherein no overlap exists between orthographic projections of the auxiliary electrode line and the auxiliary electrode on a substrate of the display substrate, and
wherein the at least one auxiliary electrode comprises a first auxiliary electrode and a second auxiliary electrode, the drive circuit comprises a driving transistor and a switching transistor, and orthographic projections on the drive circuit of the first and second auxiliary electrode are both rectangular in shape and cover the driving transistor and the switching transistor respectively, and
wherein the display substrate further comprises a film encapsulation layer, the auxiliary electrode layer is arranged between the film encapsulation layer and the cathode of the light emitting diode.

2. The display substrate according to claim 1, wherein each pixel unit is disposed with the auxiliary electrode.

3. The display substrate according to claim 2, further comprising a passivation layer covering the auxiliary electrode layer.

4. The display substrate according to claim 1, further comprising a pixel define layer which divides the display substrate into a plurality of the pixel units, wherein the auxiliary electrode layer is located on the pixel define layer, and an orthographic projection of the auxiliary electrode layer on the substrate of the display substrate and an orthographic projection of at least a portion of the drive circuit on the substrate are located within a range of an orthographic projection of the pixel define layer on the substrate.

5. The display substrate according to claim 4, further comprising a passivation layer covering the auxiliary electrode layer.

6. The display substrate according to claim 1, wherein the auxiliary electrode is in contact with the cathode directly and is located on the cathode.

7. The display substrate according to claim 6, further comprising a passivation layer covering the auxiliary electrode layer.

8. The display substrate according to claim 1, further comprising a passivation layer covering the auxiliary electrode layer.

9. The display substrate according to claim 1, wherein no overlap exists between orthographic projections of the auxiliary electrode and a light emitting region of the light emitting diode on the substrate of the display substrate.

10. A display panel, comprising a display substrate and a packaging cover plate for packaging the display substrate, wherein the display substrate comprising:
a plurality of pixel units, at least one pixel comprising a light emitting diode and a drive circuit, the light emitting diode comprising a cathode; and
an auxiliary electrode layer comprising at least one auxiliary electrode, wherein the at least one auxiliary electrode is disposed in at least one of the plurality of the pixel units,
wherein the auxiliary electrode is electrically connected with the cathode of the light emitting diode which is located in the same pixel unit as the pixel unit that the auxiliary electrode is located in, and the auxiliary electrode covers at least a portion of the drive circuit in the pixel unit that the auxiliary electrode is located in, the auxiliary electrode is made of an opaque conductive material, so as to block light irradiated at the portion of the drive circuit that is covered by the auxiliary electrode, wherein the auxiliary electrode layer further comprises auxiliary electrode line, the display substrate comprises a gate line and a data line, and the auxiliary electrode line is for covering the gate line and/or the data line, wherein the auxiliary electrode line and the auxiliary electrode are independent from each other but being a same conductive material, wherein no overlap exists between orthographic projections of the auxiliary electrode line and the auxiliary electrode on a substrate of the display substrate, and wherein the at least one auxiliary electrode comprises a first auxiliary electrode and a second auxiliary electrode, the drive circuit comprises a driving transistor and a switching transistor, and orthographic projections on the drive circuit of the first and second auxiliary electrode are both rectangular in shape and cover the driving transistor and the switching transistor respectively, wherein the display substrate further comprises a film encapsulation layer, the auxiliary electrode layer is arranged between the film encapsulation layer and the cathode of the light emitting diode.

11. The display panel according to claim 10, wherein no overlap exists between orthographic projections of the auxiliary electrode and a light emitting region of the light emitting diode on the substrate of the display substrate.

12. A pixel unit, comprising:
a light emitting diode comprising a cathode;
a drive circuit configured to control the light emission of the light emitting diode; and
an auxiliary electrode electronically connected with the cathode and covering at least a portion of the drive circuit, wherein the auxiliary electrode is made of an opaque conductive material, so as to block light irradiated at the portion of the drive circuit that is covered by the auxiliary electrode, wherein a gate line, a data line, and an auxiliary electrode layer are provided in a display substrate comprising the pixel unit, the auxiliary electrode layer comprises an auxiliary electrode line, and the auxiliary electrode line is for covering the gate line and/or the data line, wherein the auxiliary electrode line and the auxiliary electrode are independent from each other but being a same conductive material, wherein no overlap exists between orthographic projections of the auxiliary electrode line and the auxiliary electrode on a substrate of the display substrate, and wherein the at least one auxiliary electrode comprises a first auxiliary electrode and a second auxiliary electrode, the drive circuit comprises a driving transistor and a switching transistor, and orthographic projections on the drive circuit of the first and second auxiliary electrode are both rectangular in shape and cover the driving transistor and the switching transistor respectively, wherein the display substrate further comprises a film encapsulation layer, the auxiliary electrode layer is arranged between the film encapsulation layer and the cathode of the light emitting diode.

13. The pixel unit according to claim 12, wherein the auxiliary electrode is in contact with the cathode directly and is located on the cathode.

14. The pixel unit according to claim 12, wherein no overlap exists between orthographic projections of the auxiliary electrode and a light emitting region of the light emitting diode on the substrate of the display substrate.

\* \* \* \* \*